US012247314B2

(12) United States Patent
Samanta et al.

(10) Patent No.: US 12,247,314 B2
(45) Date of Patent: *Mar. 11, 2025

(54) SYSTEMS FOR PRODUCTION OF LOW OXYGEN CONTENT SILICON

(71) Applicant: GlobalWafers Co., Ltd., Hsinchu (TW)

(72) Inventors: Gaurab Samanta, Brentwood, MO (US); Parthiv Daggolu, Creve Coeur, MO (US); Sumeet Bhagavat, St. Charles, MO (US); Soubir Basak, Chandler, AZ (US); Nan Zhang, O'Fallon, MO (US)

(73) Assignee: GlobalWafers Co., Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/626,962

(22) Filed: Apr. 4, 2024

(65) Prior Publication Data
US 2024/0247402 A1 Jul. 25, 2024

Related U.S. Application Data

(63) Continuation of application No. 18/298,713, filed on Apr. 11, 2023, now Pat. No. 12,037,699, which is a (Continued)

(51) Int. Cl.
C30B 15/20 (2006.01)
C30B 15/10 (2006.01)
(Continued)

(52) U.S. Cl.
CPC ............. *C30B 15/20* (2013.01); *C30B 15/10* (2013.01); *C30B 15/30* (2013.01); *C30B 15/305* (2013.01); *C30B 29/06* (2013.01); *C30B 30/04* (2013.01)

(58) Field of Classification Search
CPC ......... C30B 15/20; C30B 15/10; C30B 15/30; C30B 15/305; C30B 29/06; C30B 20/04; Y10T 117/1032; Y10T 117/1072
See application file for complete search history.

(56) References Cited

U.S. PATENT DOCUMENTS 5,178,720 A 1/1993 Frederick
5,766,341 A 6/1998 Kimbel
(Continued)

FOREIGN PATENT DOCUMENTS

CN 1178844 A 4/1998
DE 102008062049 A1 12/2009
(Continued)

OTHER PUBLICATIONS

Xin Liu et al., "Effects of cusp-shaped magnetic field on melt convection and oxygen transport in an industrial CZ-Si crystal growth," Journal of Crystal Growth 354 (2012), 101-108.
(Continued)

*Primary Examiner* — Robert M Kunemund
(74) *Attorney, Agent, or Firm* — Armstrong Teasdale LLP

(57) ABSTRACT

A method for producing a silicon ingot includes withdrawing a seed crystal from a melt that includes melted silicon in a crucible that is enclosed in a vacuum chamber containing a cusped magnetic field. At least one process parameter is regulated in at least two stages, including a first stage corresponding to formation of the silicon ingot up to an intermediate ingot length, and a second stage corresponding to formation of the silicon ingot from the intermediate ingot length to the total ingot length. During the second stage process parameter regulation may include reducing a crystal rotation rate, reducing a crucible rotation rate, and/or increasing a magnetic field strength relative to the first stage.

17 Claims, 11 Drawing Sheets

Related U.S. Application Data continuation of application No. 17/380,393, filed on Jul. 20, 2021, now Pat. No. 11,668,020, which is a continuation of application No. 16/916,577, filed on Jun. 30, 2020, now Pat. No. 11,136,691, which is a continuation of application No. 15/780,520, filed as application No. PCT/US2016/064448 on Dec. 1, 2016, now Pat. No. 10,745,823.

(60) Provisional application No. 62/263,355, filed on Dec. 4, 2015.

(51) Int. Cl.
*C30B 15/30* (2006.01)
*C30B 29/06* (2006.01)
*C30B 30/04* (2006.01)

(56) References Cited

U.S. PATENT DOCUMENTS

| | | | |
|---|---|---|---|
| 5,779,791 | A | 7/1998 | Korb et al. |
| 6,019,837 | A | 2/2000 | Maeda et al. |
| 6,113,688 | A | 9/2000 | Kawanishi et al. |
| 6,267,816 | B1 | 7/2001 | Izumi |
| 6,325,851 | B1 | 12/2001 | Onoue |
| 9,885,122 | B2 | 2/2018 | Soeta et al. |
| 10,745,823 | B2 | 8/2020 | Samanta et al. |
| 11,136,691 | B2 | 10/2021 | Samanta et al. |
| 11,668,020 | B2 | 6/2023 | Samanta et al. |
| 12,037,699 | B2 * | 7/2024 | Samanta ................ C30B 29/06 |
| 2002/0139298 | A1 | 10/2002 | Okui et al. |
| 2005/0263063 | A1 | 12/2005 | Harada et al. |
| 2006/0005761 | A1 | 1/2006 | Kulkarni et al. |
| 2008/0107582 | A1 | 5/2008 | Hong |
| 2009/0293801 | A1 | 12/2009 | Kuragaki |
| 2009/0301385 | A1 | 12/2009 | Kuroki et al. |
| 2010/0029039 | A1 | 2/2010 | Shan et al. |
| 2010/0059861 | A1 | 3/2010 | Mueller et al. |
| 2016/0068992 | A1 | 3/2016 | Sakurada et al. |
| 2016/0181313 | A1 | 6/2016 | Kadono et al. |
| 2018/0355509 | A1 | 12/2018 | Samanta et al. |

FOREIGN PATENT DOCUMENTS

| | | |
|---|---|---|
| EP | 0874069 A1 | 10/1998 |
| JP | H1072277 A | 3/1998 |
| JP | 2009018984 A | 1/2009 |
| JP | 2010222241 A | 7/2010 |
| WO | 2004044277 A1 | 5/2004 |
| WO | 2014190165 A2 | 11/2014 |

OTHER PUBLICATIONS

V.V. Voronkov, et al., Comprehensive Semiconductor Science and Technology; "Fundamentals and Engineering of the Czochralski Growth of Semiconductor Silicon Crystals" (2011), pp. 81-169.

* cited by examiner

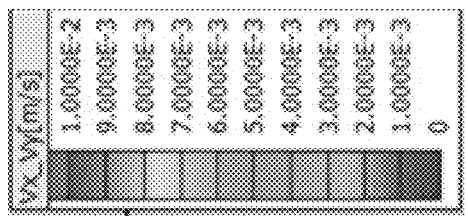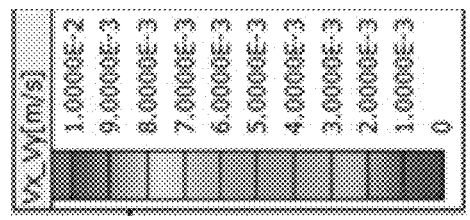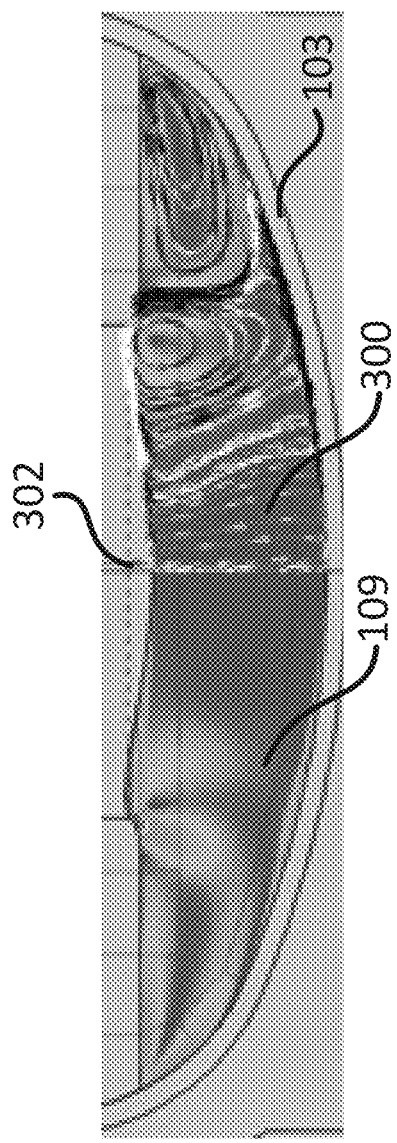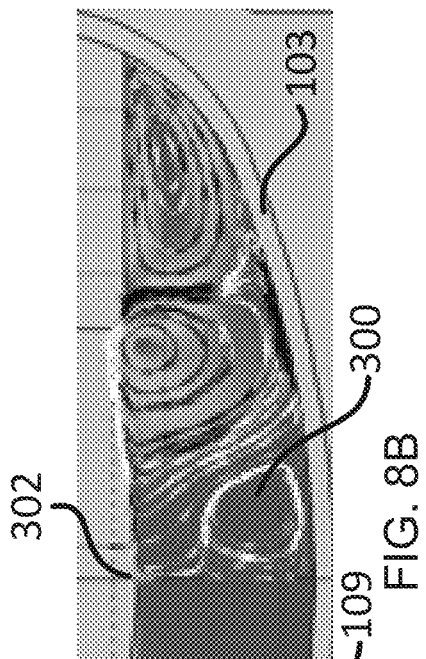
FIG. 8A  FIG. 8B

SYSTEMS FOR PRODUCTION OF LOW OXYGEN CONTENT SILICON

CROSS REFERENCE TO RELATED APPLICATIONS

This application is a continuation of U.S. patent application Ser. No. 18/298,713, filed Apr. 11, 2023 now U.S. Pat. No. 12,037,699, which is a continuation of U.S. patent application Ser. No. 17/380,393, filed Jul. 20, 2021, now U.S. Pat. No. 11,668,020, which is a continuation of U.S. patent application Ser. No. 16/916,577, filed Jun. 30, 2020, now U.S. Pat. No. 11,136,691, which is a continuation of U.S. patent application Ser. No. 15/780,520, filed May 31, 2018, now U.S. Pat. No. 10,745,823, which is the 35 U.S.C. § 371 national stage of International Application No. PCT/US2016/064448, filed Dec. 1, 2016, which claims priority to U.S. Patent Application No. 62/263,355, filed Dec. 4, 2015. Each of these applications is incorporated herein by reference in its entirety.

FIELD

This disclosure generally relates to the production of silicon ingots, and more specifically, to methods and systems for producing silicon ingots having a low oxygen concentration.

BACKGROUND

Single crystal silicon is the starting material in many processes for fabricating semiconductor electronic components and solar materials. For example, semiconductor wafers produced from silicon ingots are commonly used in the production of integrated circuit chips. In the solar industry, single crystal silicon may be used instead of multicrystalline silicon due to the absence of grain boundaries and dislocations. Single crystal silicon ingots are machined into a desired shape, such as a silicon wafer, from which the semiconductor or solar wafers can be produced Existing methods to produce high-purity single crystal silicon ingot include a float zone method and a magnetic field applied Czochralski (MCZ) process. The float zone method includes melting a narrow region of a rod of ultrapure polycrystalline silicon and slowly translating the molten region along the rod to produce a single crystal silicon ingot of high purity. The MCZ process produces single crystal silicon ingots by melting polycrystalline silicon in a crucible, dipping a seed crystal into the molten silicon, and withdrawing the seed crystal in a manner sufficient to achieve the diameter desired for the ingot. A horizontal and/or vertical magnetic field may be applied to the molten silicon to inhibit the incorporation of impurities, such as oxygen, into the growing single crystal silicon ingot. Although float zone silicon ingots typically contain relatively low concentrations of impurities, such as oxygen, the diameter of ingots grown using the float zone method are typically no larger than about 150 mm due to limitations imposed by surface tension. MCZ silicon ingots may be produced at higher ingot diameters compared to float zone ingots, but MCZ silicon ingots typically contain higher concentrations of impurities.

During the process of producing single crystal silicon ingots using the MCZ method, oxygen is introduced into silicon crystal ingots through a melt-solid or melt crystal interface. The oxygen may cause various defects in wafers produced from the ingots, reducing the yield of semiconductor devices fabricated using the ingots. For example, insulated-gate bipolar transistors (IGBTs), high quality radio-frequency (RF), high resistivity silicon on insulator (HR-SOI), and charge trap layer SOI (CTL-SOI) applications typically require a low oxygen concentration (Oi) in order to achieve high resistivity.

At least some known semiconductor devices are fabricated using float zone silicon materials to achieve a low Oi and high resistivity. However, float zone materials are relatively expensive and are limited to use in producing ingots having a diameter less than approximately 200 mm. Accordingly, float zone silicon materials are expensive and unable to produce higher diameter silicon crystal ingots with a relatively low oxygen concentration.

This Background section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

BRIEF SUMMARY

In one aspect, a method for producing a silicon ingot includes withdrawing a seed crystal from a melt that includes melted silicon in a crucible. The crucible is enclosed in a vacuum chamber containing a cusped magnetic field. The method further includes regulating at least one process parameter in at least two stages. The at least one process parameter includes one of a crystal rotation rate, a crucible rotation rate, and a magnetic field strength. The at least two stages include a first stage corresponding to formation of the silicon ingot up to an intermediate ingot length, and a second stage corresponding to formation of the silicon ingot from the intermediate ingot length to the total ingot length. According to the method in this embodiment, regulating the at least one process parameter during the second stage includes at least one of reducing the crystal rotation rate relative to the crystal rotation rate during the first stage, reducing the crucible rotation rate relative to the crucible rotation rate during the first stage, and increasing magnetic field strength relative to magnetic field strength during the first stage.

Another aspect is directed to a wafer generated from a silicon ingot produced using the method described above.

Still another aspect is directed to a crystal growing system for producing a silicon ingot. The system comprises a vacuum chamber and a crucible disposed within the vacuum chamber. The crucible is rotatable about an axis of symmetry, and is configured to hold a melt including molten silicon. A pull shaft is movable along the axis of symmetry, is rotatable about the axis of symmetry, and is configured to hold a seed crystal. At least one magnet can generate a controllable cusped magnetic field within the crucible. A control unit comprises a processor and a memory, the memory storing instruction that, when executed by the processor, causes the processor to withdraw the seed crystal from a melt in the crucible to form the silicon ingot. The unit also regulates at least one process parameter, wherein the at least one process parameter is regulated in at least two stages. The at least two stages comprise a first stage corresponding to formation of the silicon ingot up to an intermediate ingot length, and a second stage corresponding to formation of the silicon ingot from the intermediate ingot length to the total ingot length. The instruction, when executed by the processor, causes the processor to regulate the at least one process parameter by at least one of reducing a crystal rotation rate relative to the crystal rotation rate during the first stage, reducing a crucible rotation rate relative to the crucible rotation rate during the first stage, and increasing a magnetic field strength produced by the at least one magnet relative to the magnetic field strength produced by the at least one magnet during the first stage.

Various refinements exist of the features noted in relation to the above-mentioned aspect. Further features may also be incorporated in the above-mentioned aspect as well. These refinements and additional features may exist individually or in any combination. For instance, various features discussed below in relation to any of the illustrated embodiments may be incorporated into the above-described aspect, alone or in any combination.

BRIEF DESCRIPTION OF THE DRAWINGS

FIG. 8A is a cross-sectional view of an example crucible mapping flowlines and velocity magnitudes near a crucible wall at late body growth at a magnetic field strength corresponding to 50% balanced.

FIG. 8B is a cross-sectional view of an example crucible mapping flowlines and velocity magnitudes near a crucible wall at late body growth at a magnetic field strength corresponding to 95% balanced.

Like reference symbols in the various drawings indicate like elements.

DETAILED DESCRIPTION

Figure 1:
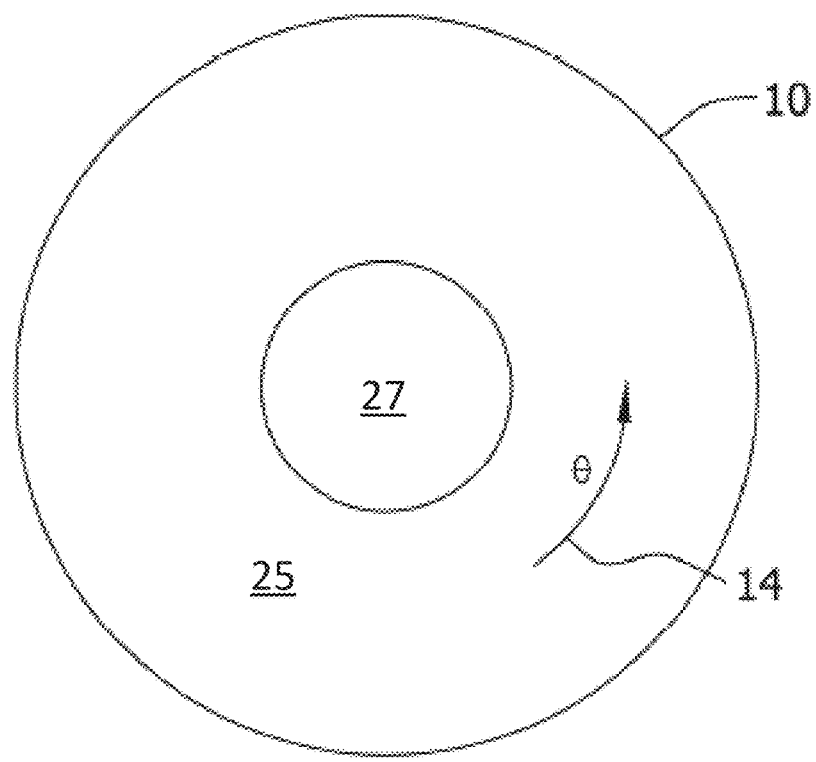
FIG. 1 is a top view of a crucible of one embodiment.
Figure 2:
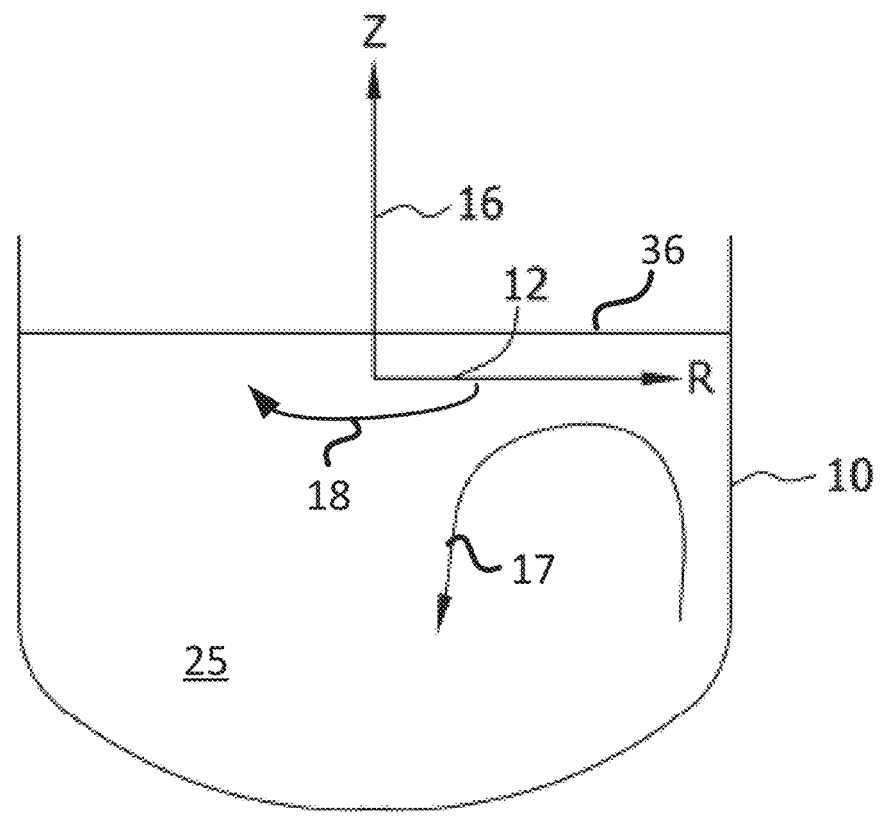
FIG. 2 is a side view of the crucible shown in FIG. 1.

Referring initially to FIGS. 1 and 2, a crucible of one embodiment is indicated generally at 10. A cylindrical coordinate system for crucible 10 includes a radial direction R 12, an angular direction θ 14, and an axial direction Z 16. Coordinates R 12, θ 14, and Z 16 are used herein to describe methods and systems for producing low oxygen silicon ingots. The crucible 10 contains a melt 25 having a melt surface 36. A crystal 27 is grown from the melt 25. The melt 25 may contain one or more convective flow cells 17, 18 induced by heating of the crucible 10 and rotation of the crucible 10 and/or crystal 27 in the angular direction θ 14. The structure and interaction of these one or more convective flow cells 17, 18 are modulated via regulation of one of more process parameters to reduce the inclusion of oxygen within the forming crystal 27 as described in detail herein below.

Figure 3:
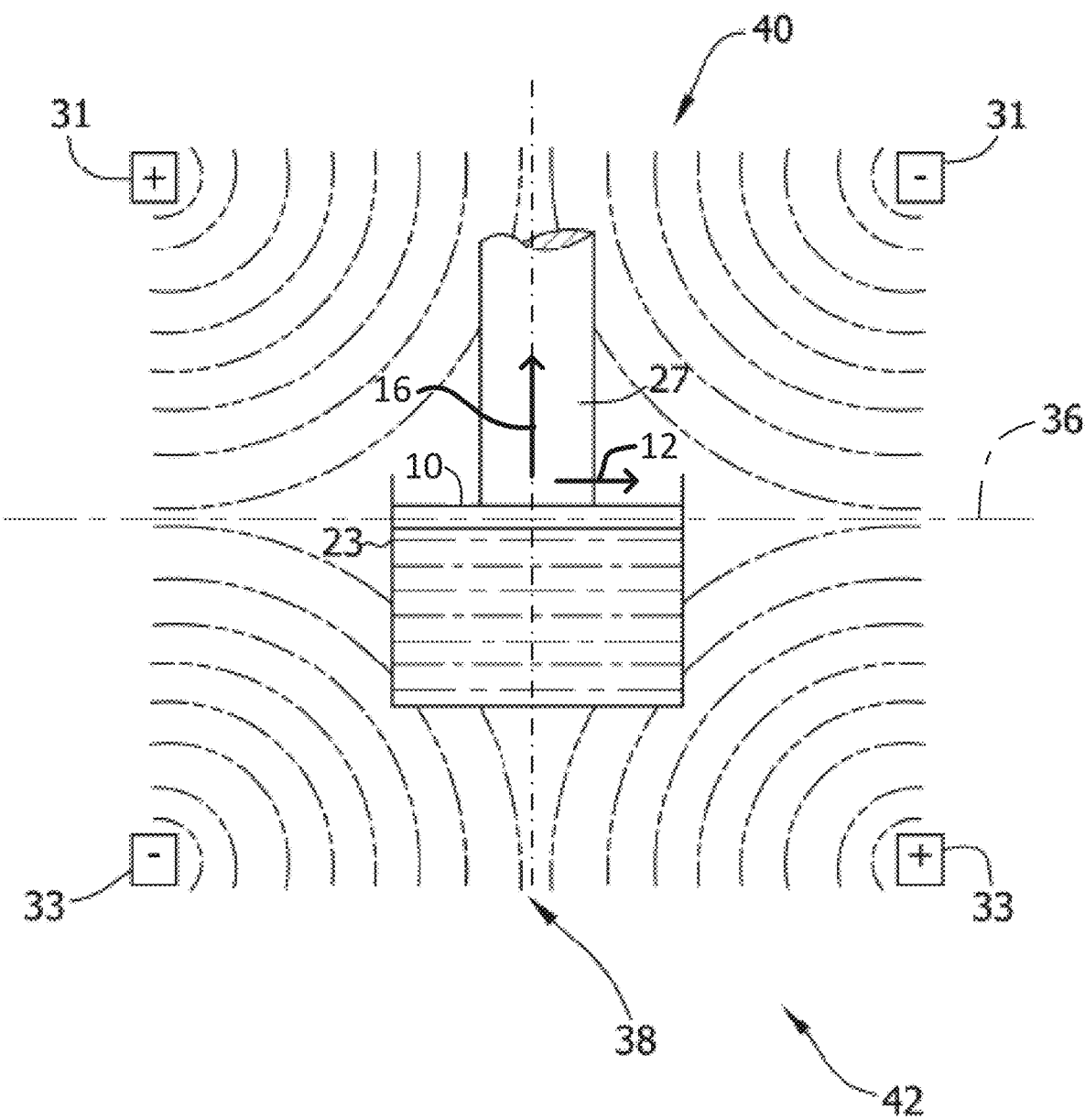
FIG. 3 is a schematic illustrating a cusped magnetic field applied to a crucible containing a melt in a crystal growing apparatus.

FIG. 3 is a block diagram illustrating a cusped magnetic field being applied to crucible 10 containing melt 25 in a crystal growing apparatus. As shown, crucible 10 contains silicon melt 25 from which a crystal 27 is grown. The cusped magnetic field configuration is designed to overcome deficiencies of axial and horizontal magnetic field configurations. A pair of coils 31 and 33 (e.g., Helmholtz coils) are placed coaxially above and below melt surface 36. Coils 31 and 33 are operated in an opposed current mode to generate a magnetic field that has a purely radial field component (i.e., along R 12) near melt surface 36 and a purely axial field component (i.e., along Z 16) near an axis of symmetry 38 of crystal 27. The combination of an upper magnetic field 40 and a lower magnetic field 42 produced by coils 31 and 33, respectively, results in axial and radial cusped magnetic field components.

Figure 4:
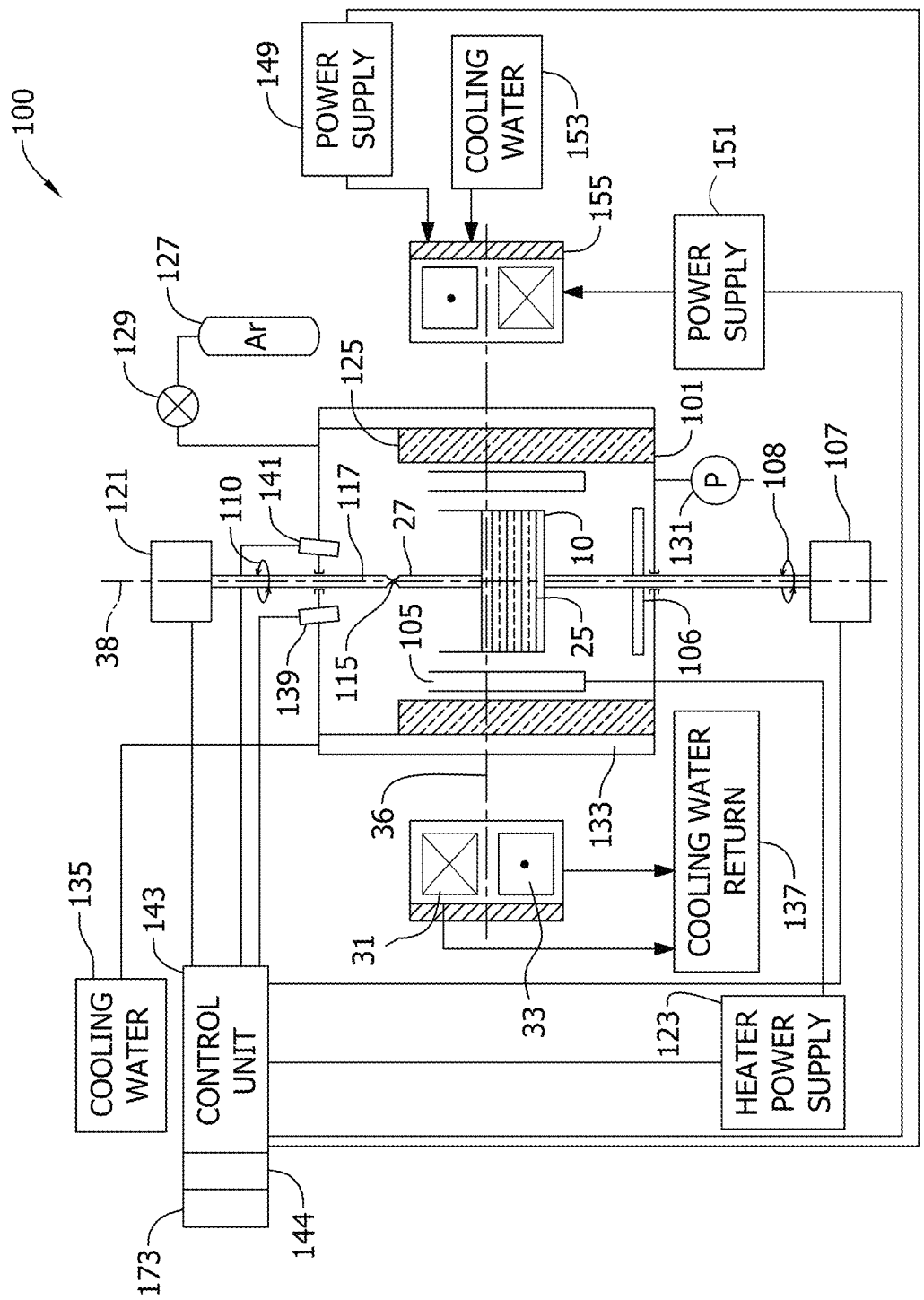
FIG. 4 is a block diagram of a crystal growing system of same embodiment as FIG. 1.

FIG. 4 is a block diagram of a crystal growing system 100. The crystal growing system 100, elements of the crystal growing system 100, and various operating parameters of the crystal growing system 100 are described in additional detail in PCT Published Application 2014/190165, which is incorporated by reference herein in its entirety. Referring again to FIG. 4, system 100 employs a Czochralski crystal growth method to produce a semiconductor ingot. In this embodiment, system 100 is configured to produce a cylindrical semiconductor ingot having an ingot diameter of greater than one-hundred fifty millimeters (150 mm), more specifically in a range from approximately 150 mm to 460 mm, and even more specifically, a diameter of approximately three-hundred millimeters (300 mm). In other embodiments, system 100 is configured to produce a semiconductor ingot having a two-hundred millimeter (200 mm) ingot diameter or a four-hundred and fifty millimeter (450 mm) ingot diameter. In addition, in one embodiment, system 100 is configured to produce a semiconductor ingot with a total ingot length of at least nine hundred millimeters (900 mm). In other embodiments, system 100 is configured to produce a semiconductor ingot with a total ingot length ranging from approximately nine hundred millimeters (900 mm) to twelve hundred millimeters (1200 mm).

Referring again to FIG. 4, the crystal growing system 100 includes a vacuum chamber 101 enclosing crucible 10. A side heater 105, for example, a resistance heater, surrounds crucible 10. A bottom heater 106, for example, a resistance heater, is positioned below crucible 10. During heating and crystal pulling, a crucible drive unit 107 (e.g., a motor)

rotates crucible 10, for example, in the clockwise direction as indicated by the arrow 108. Crucible drive unit 107 may also raise and/or lower crucible 10 as desired during the growth process. Within crucible 10 is silicon melt 25 having a melt level or melt surface 36. In operation, system 100 pulls a single crystal 27, starting with a seed crystal 115 attached to a pull shaft or cable 117, from melt 25. One end of pull shaft or cable 117 is connected by way of a pulley (not shown) to a drum (not shown), or any other suitable type of lifting mechanism, for example, a shaft, and the other end is connected to a chuck (not shown) that holds seed crystal 115 and crystal 27 grown from seed crystal 115.

Crucible 10 and single crystal 27 have a common axis of symmetry 38. Crucible drive unit 107 can raise crucible 10 along axis 38 as the melt 25 is depleted to maintain melt level 36 at a desired height. A crystal drive unit 121 similarly rotates pull shaft or cable 117 in a direction 110 opposite the direction in which crucible drive unit 107 rotates crucible 10 (e.g., counter-rotation). In embodiments using iso-rotation, crystal drive unit 121 may rotate pull shaft or cable 117 in the same direction in which crucible drive unit 107 rotates crucible 10 (e.g., in the clockwise direction). Iso-rotation may also be referred to as a co-rotation. In addition, crystal drive unit 121 raises and lowers crystal 27 relative to melt level 36 as desired during the growth process.

According to the Czochralski single crystal growth process, a quantity of polycrystalline silicon, or polysilicon, is charged to crucible 10. A heater power supply 123 energizes resistance heaters 105 and 106, and insulation 125 lines the inner wall of vacuum chamber 101. A gas supply 127 (e.g., a bottle) feeds argon gas to vacuum chamber 101 via a gas flow controller 129 as a vacuum pump 131 removes gas from vacuum chamber 101. An outer chamber 133, which is fed with cooling water from a reservoir 135, surrounds vacuum chamber 101.

The cooling water is then drained to a cooling water return manifold 137. Typically, a temperature sensor such as a photocell 139 (or pyrometer) measures the temperature of melt 25 at its surface, and a diameter transducer 141 measures a diameter of single crystal 27. In this embodiment, system 100 does not include an upper heater. The presence of an upper heater, or lack of an upper heater, alters cooling characteristics of crystal 27.

An upper magnet, such as solenoid coil 31, and a lower magnet, such as solenoid coil 33, are located above and below, respectively, melt level 36 in this embodiment. The coils 31 and 33, shown in cross-section, surround vacuum chamber (not shown) and share axes with axis of symmetry 38. In one embodiment, the upper and lower coils 31 and 33 have separate power supplies, including, but not limited to, an upper coil power supply 149 and a lower coil power supply 151, each of which is connected to and controlled by control unit 143.

In this embodiment, current flows in opposite directions in the two solenoid coils 31 and 33 to produce a magnetic field (as shown in FIG. 3). A reservoir 153 provides cooling water to the upper and lower coils 31 and 33 before draining via cooling water return manifold 137. A ferrous shield 155 surrounds coils 31 and 33 to reduce stray magnetic fields and to enhance the strength of the field produced.

A control unit 143 is used to regulate the plurality of process parameters including, but not limited to, at least one of crystal rotation rate, crucible rotation rate, and magnetic field strength. In various embodiments, the control unit 143 may include a processor 144 that processes the signals received from various sensors of the system 100 including, but not limited to, photocell 139 and diameter transducer 141, as well as to control one or more devices of system 100 including, but not limited to: crucible drive unit 107, crystal drive unit 121, heater power supply 123, vacuum pump 131, gas flow controller 129 (e.g., an argon flow controller), upper coil power supply 149, lower coil power supply 151, and any combination thereof.

Control unit 143 may be a computer system. Computer systems, as described herein, refer to any known computing device and computer system. As described herein, all such computer systems include a processor and a memory. However, any processor in a computer system referred to herein may also refer to one or more processors wherein the processor may be in one computing device or a plurality of computing devices acting in parallel. Additionally, any memory in a computer device referred to herein may also refer to one or more memories wherein the memories may be in one computing device or a plurality of computing devices acting in parallel.

The term processor, as used herein, refers to central processing units, microprocessors, microcontrollers, reduced instruction set circuits (RISC), application specific integrated circuits (ASIC), logic circuits, and any other circuit or processor capable of executing the functions described herein. The above are examples only, and are thus not intended to limit in any way the definition and/or meaning of the term "processor."

As used herein, the term "database" may refer to either a body of data, a relational database management system (RDBMS), or to both. As used herein, a database may include any collection of data including hierarchical databases, relational databases, flat file databases, object-relational databases, object oriented databases, and any other structured collection of records or data that is stored in a computer system. The above examples are example only, and thus are not intended to limit in any way the definition and/or meaning of the term database. Examples of RDBMS's include, but are not limited to including, Oracle® Database, MySQL, IBM® DB2, Microsoft® SQL Server, Sybase®, and PostgreSQL. However, any database may be used that enables the systems and methods described herein. (Oracle is a registered trademark of Oracle Corporation, Redwood Shores, California; IBM is a registered trademark of International Business Machines Corporation, Armonk, New York; Microsoft is a registered trademark of Microsoft Corporation, Redmond, Washington; and Sybase is a registered trademark of Sybase, Dublin, California.)

In one embodiment, a computer program is provided to enable control unit 143, and this program is embodied on a computer readable medium. In an example embodiment, the computer system is executed on a single computer system, without requiring a connection to a server computer. In a further embodiment, the computer system is run in a Windows® environment (Windows is a registered trademark of Microsoft Corporation, Redmond, Washington). In yet another embodiment, the computer system is run on a mainframe environment and a UNIX® server environment (UNIX is a registered trademark of X/Open Company Limited located in Reading, Berkshire, United Kingdom). Alternatively, the computer system is run in any suitable operating system environment. The computer program is flexible and designed to run in various different environments without compromising any major functionality. In some embodiments, the computer system includes multiple components distributed among a plurality of computing devices. One or more components may be in the form of computer-executable instructions embodied in a computer-readable medium.

The computer systems and processes are not limited to the specific embodiments described herein. In addition, components of each computer system and each process can be practiced independent and separate from other components and processes described herein. Each component and process also can be used in combination with other assembly packages and processes.

Figure 10:
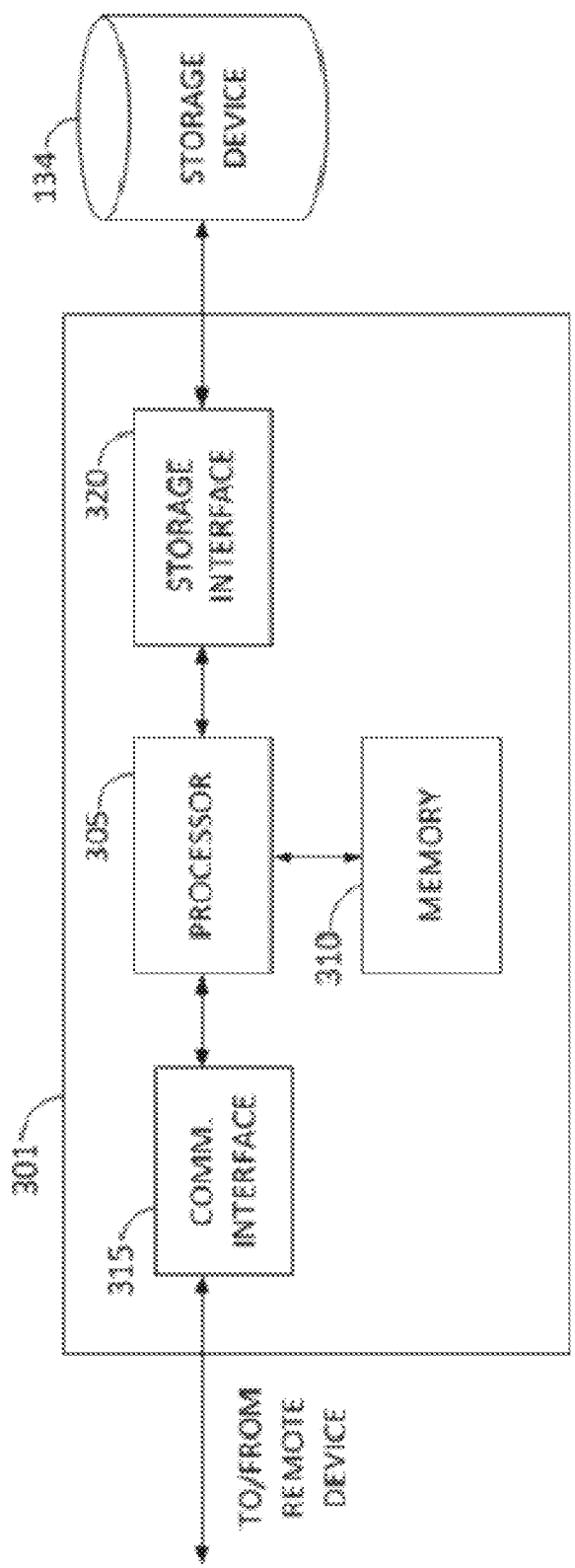
FIG. 10 is a block diagram of an example server system.

In one embodiment, the computer system may be configured as a server system. FIG. 10 illustrates an example configuration of a server system 301 used to receive measurements from one or more sensors including, but not limited to: temperature sensor 139, diameter transducer 141, and any combination thereof, as well as to control one or more devices of system 100 including, but not limited to: crucible drive unit 107, crystal drive unit 121, heater power supply 123, vacuum pump 131, gas flow controller 129 (e.g., an argon flow controller), upper coil power supply 149, lower coil power supply 151, and any combination thereof as described herein and illustrated in FIG. 4 in one embodiment. Referring again to FIG. 10, server system 301 may also include, but is not limited to, a database server. In this example embodiment, server system 301 performs all of the steps used to control one or more devices of system 100 as described herein.

Server system 301 includes a processor 305 for executing instructions. Instructions may be stored in a memory area 310, for example. Processor 305 may include one or more processing units (e.g., in a multi-core configuration) for executing instructions. The instructions may be executed within a variety of different operating systems on the server system 301, such as UNIX, LINUX, Microsoft Windows®, etc. It should also be appreciated that upon initiation of a computer-based method, various instructions may be executed during initialization. Some operations may be required in order to perform one or more processes described herein, while other operations may be more general and/or specific to a particular programming language (e.g., C, C #, C++, Java, or any other suitable programming languages).

Processor 305 is operatively coupled to a communication interface 315 such that server system 301 is capable of communicating with a remote device such as a user system or another server system 301. For example, communication interface 315 may receive requests (e.g., requests to provide an interactive user interface to receive sensor inputs and to control one or more devices of system 100 from a client system via the Internet.

Processor 305 may also be operatively coupled to a storage device 134. Storage device 134 is any computer-operated hardware suitable for storing and/or retrieving data. In some embodiments, storage device 134 is integrated in server system 301. For example, server system 301 may include one or more hard disk drives as storage device 134. In other embodiments, storage device 134 is external to server system 301 and may be accessed by a plurality of server systems 301. For example, storage device 134 may include multiple storage units such as hard disks or solid state disks in a redundant array of inexpensive disks (RAID) configuration. Storage device 134 may include a storage area network (SAN) and/or a network attached storage (NAS) system.

In some embodiments, processor 305 is operatively coupled to storage device 134 via a storage interface 320. Storage interface 320 is any component capable of providing processor 305 with access to storage device 134. Storage interface 320 may include, for example, an Advanced Technology Attachment (ATA) adapter, a Serial ATA (SATA) adapter, a Small Computer System Interface (SCSI) adapter, a RAID controller, a SAN adapter, a network adapter, and/or any component providing processor 305 with access to storage device 134.

Memory area 310 may include, but is not limited to, random access memory (RAN) such as dynamic RAM (DRAM) or static RAM (SRAM), read-only memory (ROM), erasable programmable read-only memory (EPROM), electrically erasable programmable read-only memory (EEPROM), and non-volatile RAM (NVRAM). The above memory types are exemplary only, and are thus not limiting as to the types of memory usable for storage of a computer program.

Figure 11:
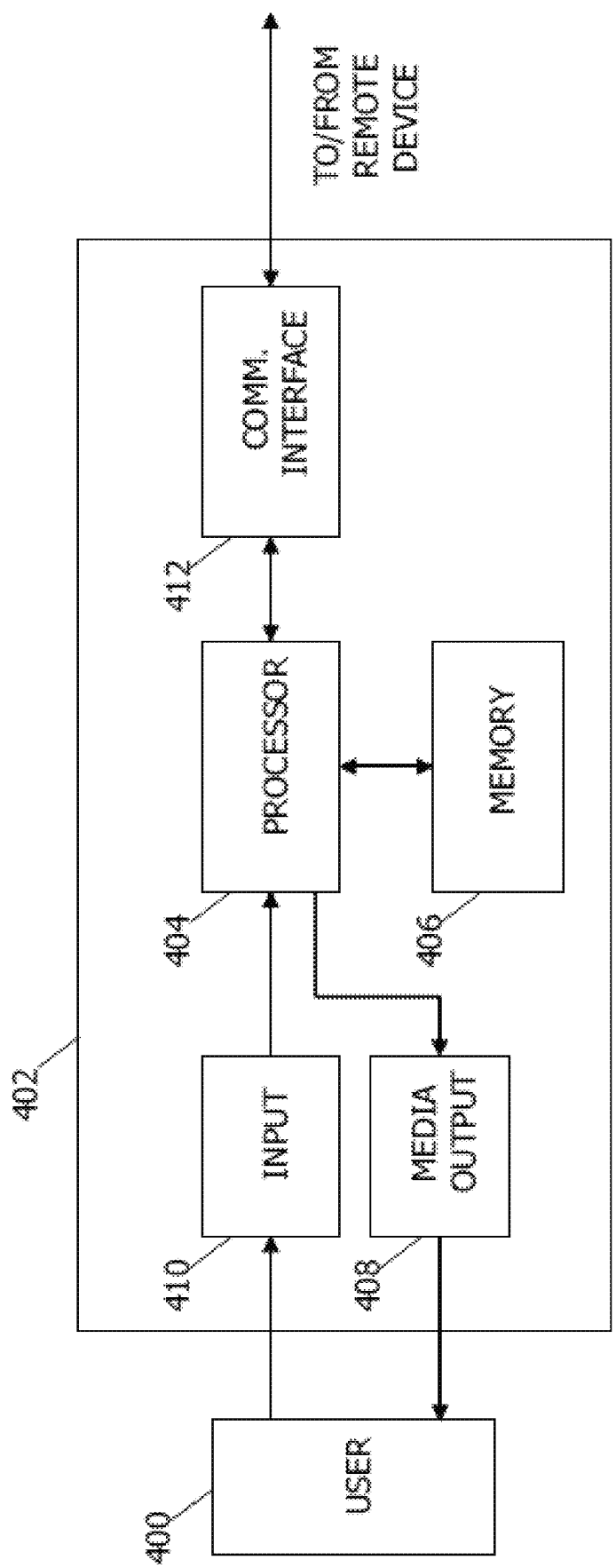
FIG. 11 is a block diagram of an example computing device.

In another embodiment, the computer system may be provided in the form of a computing device, such as a computing device 402 (shown in FIG. 11). Computing device 402 includes a processor 404 for executing instructions. In some embodiments, executable instructions are stored in a memory area 406. Processor 404 may include one or more processing units (e.g., in a multi-core configuration). Memory area 406 is any device allowing information such as executable instructions and/or other data to be stored and retrieved. Memory area 406 may include one or more computer-readable media.

In another embodiment, the memory included in the computing device of the control unit 143 may include a plurality of modules. Each module may include instructions configured to execute using at least one processor. The instructions contained in the plurality of modules may implement at least part of the method for simultaneously regulating a plurality of process parameters as described herein when executed by the one or more processors of the computing device. Non-limiting examples of modules stored in the memory of the computing device include: a first module to receive measurements from one or more sensors and a second module to control one or more devices of the system 100.

Computing device 402 also includes one media output component 408 for presenting information to a user 400. Media output component 408 is any component capable of conveying information to user 400. In some embodiments, media output component 408 includes an output adapter such as a video adapter and/or an audio adapter. An output adapter is operatively coupled to processor 404 and is further configured to be operatively coupled to an output device such as a display device (e.g., a liquid crystal display (LCD), organic light emitting diode (OLED) display, cathode ray tube (CRT), or "electronic ink" display) or an audio output device (e.g., a speaker or headphones).

In some embodiments, client computing device 402 includes an input device 410 for receiving input from user 400. Input device 410 may include, for example, a keyboard, a pointing device, a mouse, a stylus, a touch sensitive panel (e.g., a touch pad or a touch screen), a camera, a gyroscope, an accelerometer, a position detector, and/or an audio input device. A single component such as a touch screen may function as both an output device of media output component 408 and input device 410.

Computing device 402 may also include a communication interface 412, which is configured to communicatively couple to a remote device such as server system 302 or a web server. Communication interface 412 may include, for example, a wired or wireless network adapter or a wireless data transceiver for use with a mobile phone network (e.g., Global System for Mobile communications (GSM), 3G, 4G or Bluetooth) or other mobile data network (e.g., Worldwide Interoperability for Microwave Access (WIMAX)).

Stored in memory 406 are, for example, computer-readable instructions for providing a user interface to user 400 via media output component 408 and, optionally, receiving and processing input from input device 410. A user interface may include, among other possibilities, a web browser and an application. Web browsers enable users 400 to display and interact with media and other information typically embedded on a web page or a website from a web server. An application allows users 400 to interact with a server application. The user interface, via one or both of a web browser and an application, facilitates display of information related to the process of producing a single crystal silicon ingot with low oxygen content.

In the example embodiment, system 100 produces silicon crystal ingots suitable for use in device manufacturing. Advantageously, system 100 may be used to produce silicon crystal 27, a substantial portion or all of which is substantially free of agglomerated intrinsic point defects. Furthermore, system 100 may be used to produce crystal 27 having substantially no agglomerated defects that are larger than approximately one hundred twenty nanometers (nm) in diameter, or more particularly, approximately ninety nm in diameter. The shape of the melt-solid or melt-crystal interface and the pull speed is controlled during crystal growth to limit and/or suppress the formation of agglomerated intrinsic point defects.

During production, oxygen is introduced into silicon crystal ingots through the melt-solid or melt crystal interface. However, oxygen may cause various defects in wafers produced from the ingots, reducing the yield of semiconductor devices. Accordingly, it is desirable to produce silicon crystal ingots with a low oxygen concentration. Using the methods described herein, silicon crystal ingots are produced having an oxygen concentration less than approximately 5 parts per million atoms (ppma).

Without being limited to any particular theory, oxygen is introduced into the growing silicon crystal ingot emerging from the melt by an interacting series of events, each of which is influenced by at least one process parameter as described herein below. SiO is introduced into the melt via dissolution at the crucible wall. The SiO introduced at the crucible wall may be moved elsewhere in the melt via flow induced by buoyancy forces created by localized heating of the melt neat the crucible wall. The SiO may be further moved by additional flow induced by the rotation rate of the crystal at the melt-crystal interface as well as rotation rate of the crucible itself. The concentration of SiO in the melt may be reduced via evaporation from the melt at the exposed surface of the melt. The interaction of any combination of dissolution, convection, and evaporation of SiO within the melt influences the concentration of SiO in the melt situated near the crystal-melt interface that is formed into the silicon crystal ingot. In various aspects, any one or more process parameters are simultaneously regulated to reduce the concentration of SiO situated near the melt-crystal interface, and consequently reduce the oxygen concentration within the silicon crystal ingot formed according to the method.

In various embodiments, various process parameters are regulated simultaneously to facilitate producing silicon crystal ingots with a low oxygen concentration. In one embodiment, the various process parameters are regulated in at least two stages that include an intermediate body growth stage corresponding to growth of the silicon crystal ingot up to an intermediate ingot lengths of approximately 800 mm, and a late body growth stage corresponding to growth of the silicon crystal ingot from an intermediate ingot length of approximately 800 mm up to the total ingot length. In this embodiment, the regulation of the various process parameters in at least two different stages accounts for changes in the nature of the interaction of dissolution, convection, evaporation of SiO within the melt, depth of the melt in the crucible, and the flow cells within the melt in the crucible as the silicon crystal ingot grows in length.

In particular, the role of convection is modified over the formation of the entire silicon crystal ingot due to a decrease in the depth of the melt within the crucible associated with growth of the silicon crystal ingot, as described in detail below. As a result, at the late body growth stage, the regulation of at least one process parameter is modified differently relative to the regulation of these same parameters at the intermediate body growth stage. In some embodiments, at the late body growth stage, the regulation of at least three process parameters is modified differently relative to the regulation of these same parameters at the intermediate body growth stage. As described herein below, the regulation of the process parameters modulate various factors related to the convection of SiO within the melt at the late body growth stage. In one embodiment, the process parameters with modified regulation during the late body growth stage include, but are not limited to: seed rotation rate, crucible rotation rate, and magnetic field strength.

Referring again to FIG. 4, seed rotation rate refers to the rate at which pull shaft or cable 117 rotates seed crystal 115 about axis 38. Seed rotation rate impacts the flow of SiO from crucible 10 to crystal 27 and a rate of SiO evaporation from melt 25. Referring again to FIG. 2, the flow of SiO from crucible 10 to crystal 27 is influenced generally by interactions between crystal flow cell 18 driven by the rotation of crystal 27 at the seed rotation rate within melt 25 and buoyancy flow cell 17 driven by heating of melt 25 within crucible 10. The impact of seed rotation rate on the flow of SiO from crucible 10 to crystal 27 differs depending on the stage of growth of crystal 27.

Figure 5A:
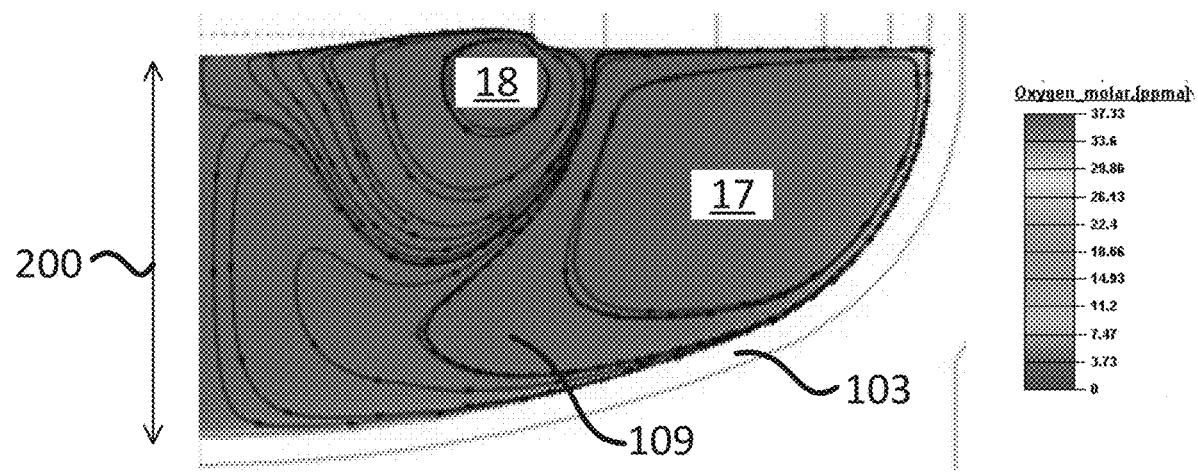
FIG. 5A is a cross-sectional view of a portion of a crucible showing flowlines and oxygen concentration near the crucible wall at intermediate body growth at a given crystal rotation rate.

FIG. 5A is a cross-sectional view of simulated flowlines and oxygen concentrations within melt 25 at an intermediate body growth stage, corresponding to growth of crystal 27 up to an intermediate ingot length of approximately 800 mm. At the intermediate body growth stage, depth 200 of melt 25 within crucible 10 is sufficiently deep to effectively decouple interactions between fluid motion induced by crystal flow cell 18 and buoyancy flow cell 17. A high seed rotation rate (i.e. 12 rpm) reduces the boundary layer thickness between melt line 36 and the gas above melt 25 to increase SiO evaporation. Further, a high seed rotation rate decreases melt flow from crucible 10 to crystal 27 by suppressing buoyancy flow cell 17 with induced crystal flow cell 18, as illustrated in FIG. 5A. Moreover, a high seed rotation rate creates an outward radial flow that retards the inward flow (i.e., transport) of SiO from crucible 10, reducing the oxygen concentration in crystal 27.

Figure 5B:
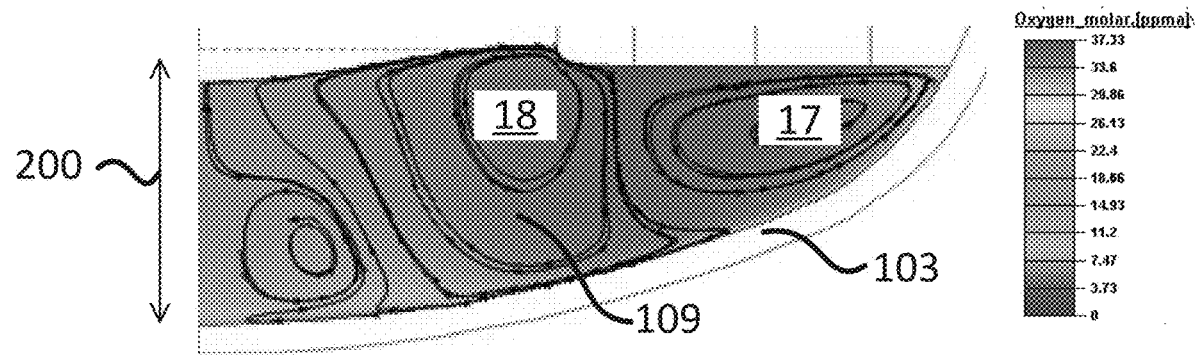
FIG. 5B is a cross-sectional view of a portion of an example crucible mapping flowlines and oxygen concentration near the crucible wall at late body growth at a crystal rotation rate.

FIG. 5B is a cross-sectional view of simulated flowlines and oxygen concentrations within melt 25 at a late body growth stage, corresponding to growth of crystal 27 from an intermediate ingot length of approximately 800 mm up to the total ingot length. Due to removal of melt 25 from crucible 10 associated with formation of crystal 27, depth 200 at the late body growth stage is shallower with respect to depth 200 at intermediate body growth stage as illustrated in FIG. 5A. At a similarly high seed rotation rate to that used to perform the simulation illustrated in FIG. 5A (i.e. 12 rpm), crystal flow cell 18 contacts the inner wall of crucible 10, causing convection of SiO formed at the inner wall of crucible 10 into crystal 27 formed at the late body growth stage.

Figure 5C:
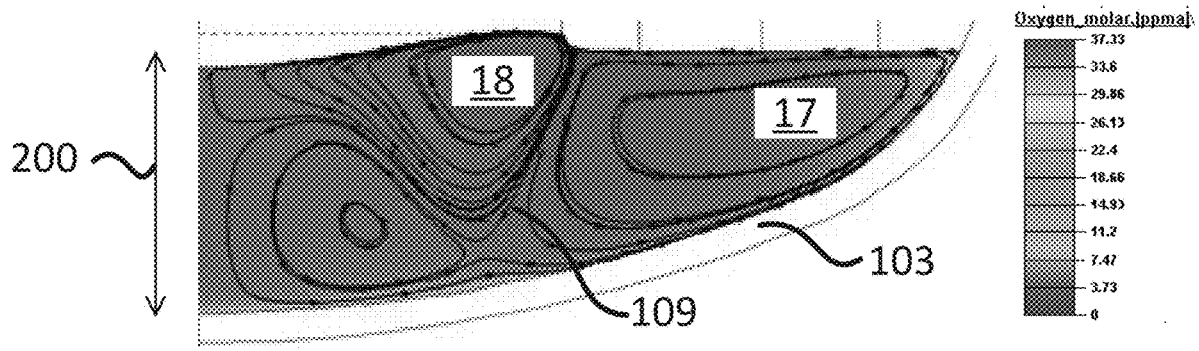
FIG. 5C is a cross-sectional view of a portion of a crucible mapping flowlines and oxygen concentration near the crucible wall at late body growth at a different crystal rotation rate.

FIG. 5C is a cross-sectional view of simulated flowlines and oxygen concentrations within melt 25 at a late body growth stage calculated at a lower (e.g., 8 rpm) seed rotation rate. Crystal flow cell 18 induced by the lower seed rotation rate does not extend to the inner wall of crucible 10, but instead is excluded by buoyancy cell 17. As a result, the flow of SiO produced at the inner wall of crucible 10 to crystal 27 is disrupted, thereby reducing the oxygen concentration within crystal 27 formed at the late body growth stage at reduced seed rotation rate.

As described herein, the transition from an intermediate to a late body growth stage is a soft transition. The transition may vary depending on various parameters of the process, such as crucible size, shape, depth of melt, modeling parameters, and the like. Generally, at the intermediate body growth stage, parameters are such that there are limited or no interactions between fluid motion induced by crystal flow cell 18 and buoyancy flow cell 17; the crystal flow cell 18 and buoyancy flow cell 17 are effectively decoupled. At the late body growth stage, parameters are such that there are interactions between fluid motion induced by crystal flow cell 18 and buoyancy flow cell 17; the crystal flow cell 18 and buoyancy flow cell 17 are effectively coupled. By way of non-limiting example, late body growth stage occurs when less than about 37% of the initial mass of melt 25 is left in crucible 10 in an embodiment that includes an initial melt mass of 250 kg in a crucible 10 with an inner diameter of about 28 inches. In various embodiments, depth 200 of melt 25 within crucible 10 is monitored to identify the transition from the intermediate to a late body growth stage. In other examples, the late body growth stage occurs when less than about 35%, less than about 40%, less than about 45%, or less than about 50% of the initial mass of melt 25 is left in crucible 10. In some embodiments, the transition from intermediate to late body growth stage is determined based on the depth of melt 25, or any other suitable parameter.

In various embodiments, the method includes regulating the seed rotation rate in at least two stages including, but not limited to, the intermediate body growth stage and the late body growth stage. In one embodiment, the method includes rotating crystal 27 during the intermediate body growth stage at a seed rotation rate ranging from approximately 8 to 14 rpm, and more specifically 12 rpm. In this embodiment, the method further includes reducing the seed rotation rate at the late body growth stage to a seed rotation rate ranging from approximately 6 rpm to 8 rpm, and more specifically 8 rpm.

Figure 6:
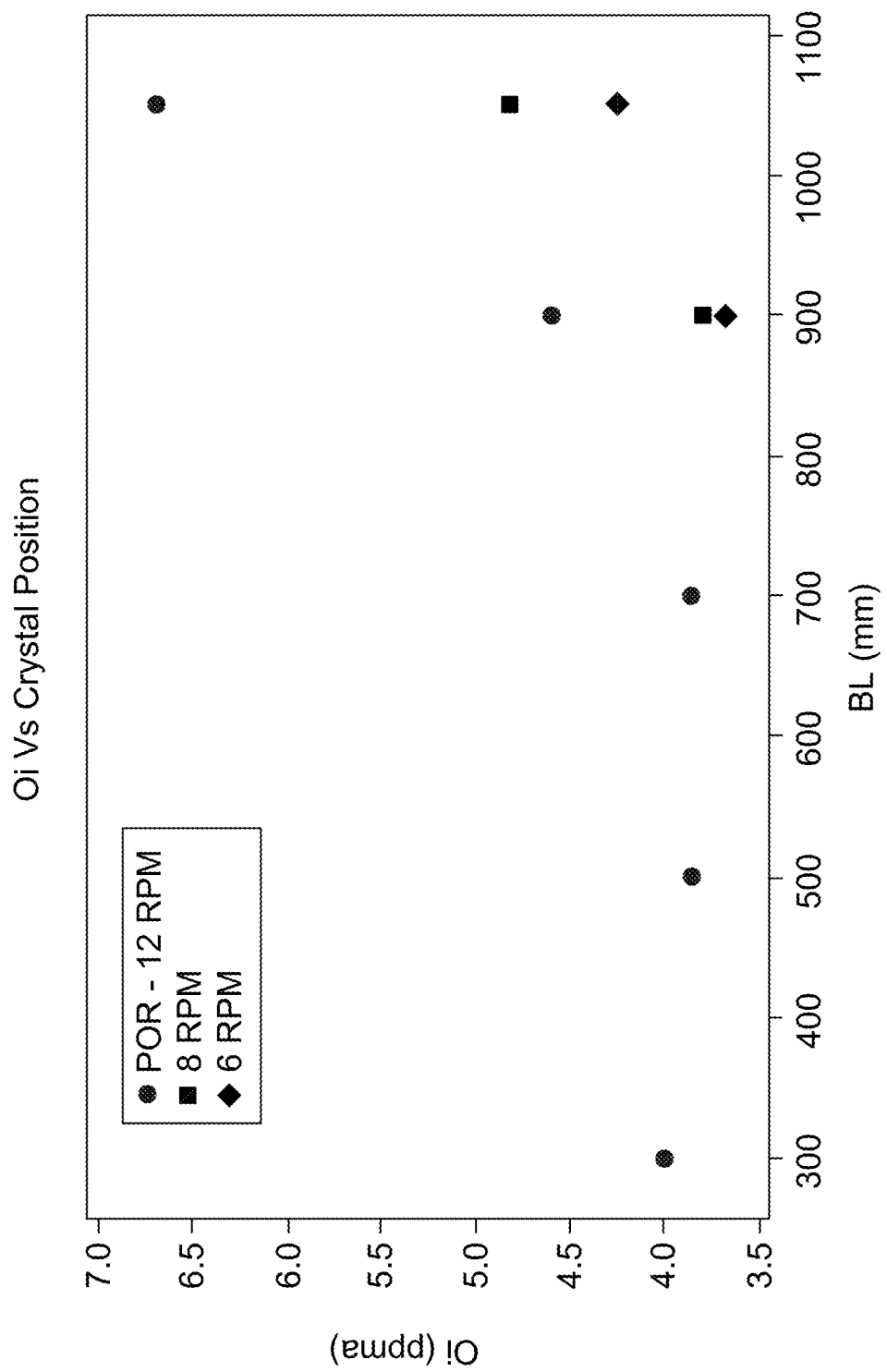
FIG. 6 is a graph plotting a simulated oxygen concentration (Oi) as a function of crystal rotation rate at late body growth versus position (BL) along the crystal.
Figure 9:
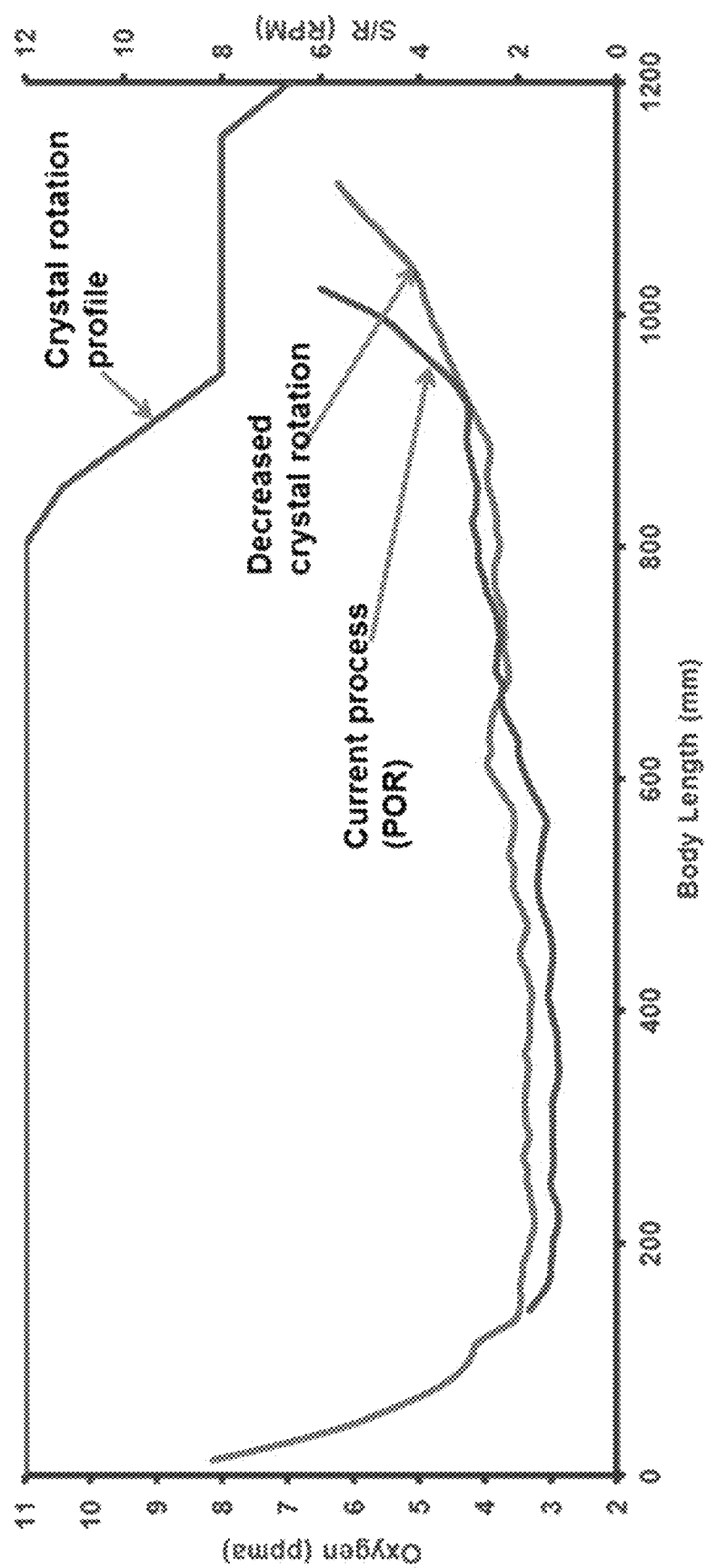
FIG. 9 is a graph plotting oxygen concentration as a function of crystal body length for two different crystal rotation rate profiles.

In another embodiment, the seed rotation rate may be reduced according to the intermediate ingot length. By way of non-limiting example, the seed rotation rate may be regulated to approximately 12 rpm for intermediate ingot lengths up to approximately 850 mm, and may be further regulated to linearly decrease to approximately 8 rpm at an intermediate ingot length of approximately 950 mm, and then regulate seed rotation rate at approximately 8 rpm up to the total ingot length, as illustrated in FIG. 9. As also illustrated in FIG. 9, the oxygen content of the crystal within the body length ranging from approximately 800 mm to the total ingot length is reduced compared to a crystal formed at a constant seed rotation rate of approximately 12 rpm. FIG. 6 is a graph comparing the simulated oxygen concentration of crystals formed at seed rotation rates according to three rotation schedules: a) rotation at 12 rpm for the formation of the entire crystal; b) rotation at 12 rpm up to an intermediate crystal length of 900 mm followed by rotation at 8 rpm for formation of the remaining crystal length; and c) rotation at 12 rpm up to an intermediate crystal length of 900 mm followed by rotation at 6 rpm for formation of the remaining crystal length. As illustrated in FIG. 6, lower seed rotation rates reduced oxygen concentration within the portion of the crystal formed at the late body growth stage.

Crucible rotation rate may further influence the oxygen concentrations within crystals 27 formed according to embodiments of the method. Crucible rotation rate refers to the rate at which crucible 10 is rotated about axis 38 using crucible drive unit 107. Crucible rotation rate impacts the flow of SiO from crucible 10 to crystal 27 and an amount of SiO evaporating from melt 25. A high crucible rotation rate reduces both a boundary layer thickness between crucible 10 and melt 25, and a boundary layer thickness between melt line 36 and the gas above melt 25. However, to minimize the oxygen concentration in crystal 27, a thicker boundary layer between crucible 10 and melt 25 is desired to reduce the SiO transport rate, while a thinner boundary layer between melt line 36 and the gas above melt 25 is desired to increase the SiO evaporation rate. Accordingly, the crucible rotation rate is selected to balance the competing interests of a high boundary layer thickness between crucible 10 and melt 25 resulting from slower crucible rotation rates and a low boundary layer thickness between melt line 36 and the gas above melt 25 resulting from higher crucible rotation rates.

Changes in depth 200 of melt 10 between intermediate body growth stage and late body growth stage described herein above influence the impact of modulation of crucible rotation rate on oxygen concentration in a manner similar to the influence of seed rotation rate described herein previously. In various embodiments, the method includes regulating the crucible rotation rate in at least two stages including, but not limited to, the intermediate body growth stage and the late body growth stage. In one embodiment, the method includes rotating crucible 10 at the intermediate body growth stage at a crucible rotation rate ranging from approximately 1.3 rpm to approximately 2.2, and more specifically 1.7 rpm. In this embodiment, the method further includes reducing the crucible rotation rate at the late body growth stage to a crucible rotation rate ranging from approximately 0.5 rpm to approximately 1.0 rpm, and more specifically 1 rpm.

Figure 7A:
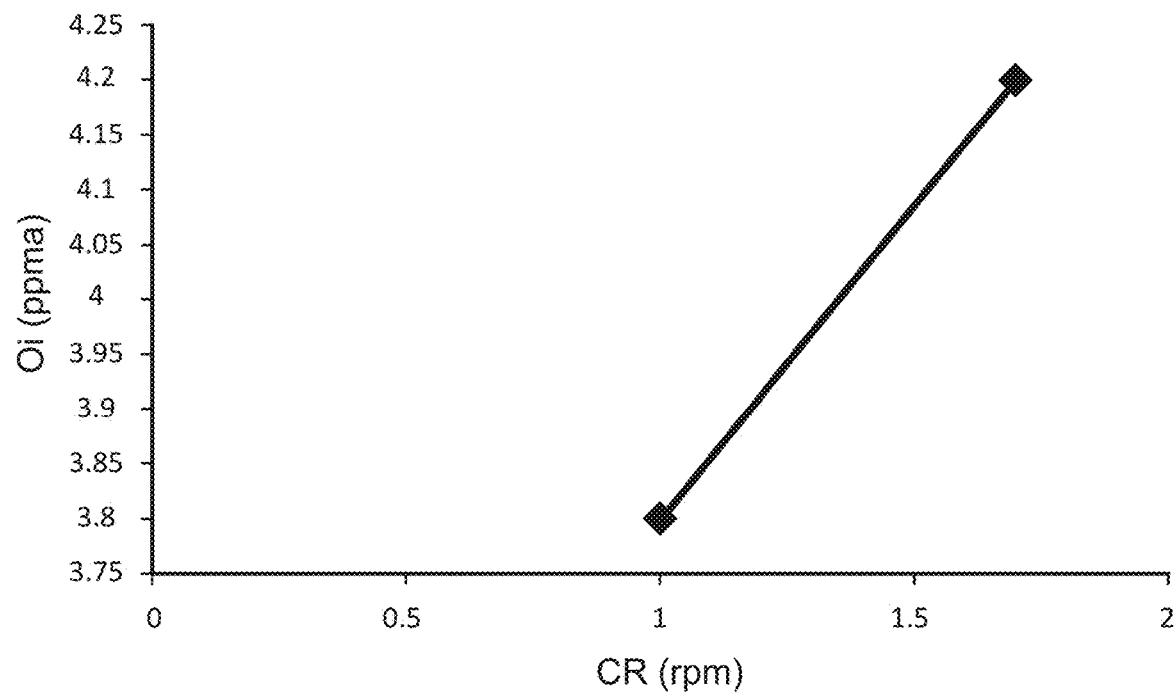
FIG. 7A is a graph plotting an oxygen concentration at late body growth versus crucible rotation rate for a crystal body rotation rate of 6 rpm.
Figure 7B:
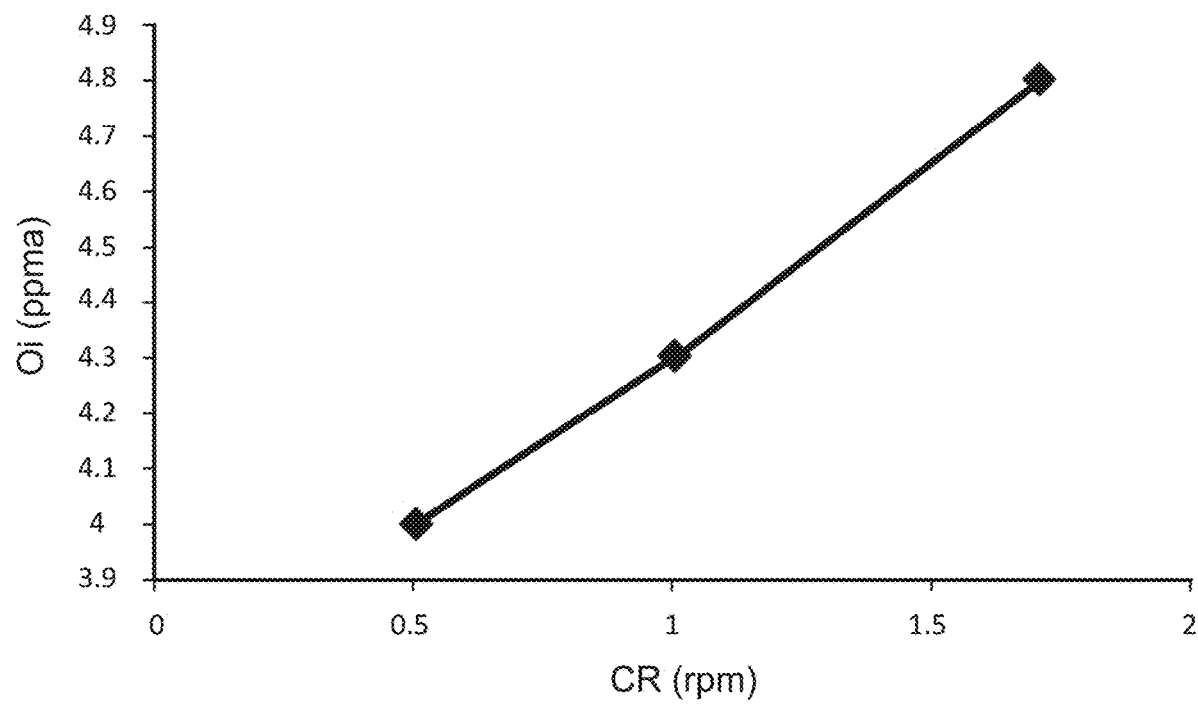
FIG. 7B is a graph plotting an oxygen concentration at late body growth versus crucible rotation rate for a crystal body rotation rate of 8 rpm.

FIGS. 7A and 7B are graphs showing a simulated oxygen concentration within silicon ingots as a function of the crucible rotation rate at late body growth stage. The silicon ingots of FIG. 7A were formed using an embodiment of the method in which the seed rotation rate was reduced from 12 rpm to 6 rpm at late body growth stage, and the crucible rotation rate was reduced from about 1.7 rpm to 1 rpm or 1.5 rpm at late body growth stage. The silicon ingots of FIG. 7B were formed using an embodiment of the method in which the seed rotation rate was reduced from 12 rpm to 8 rpm at late body growth stage, and the crucible rotation rate was reduced from about 1.7 rpm to 0.5 rpm, 1 rpm, or 1.5 rpm at late body growth stage. In both simulations, lower crucible rotation rates were associated with lower oxygen concentrations within the resulting silicon ingot.

The method may further include regulating magnet strength in at least two stages including, but not limited to, the intermediate body growth stage and the late body growth stage. Magnet strength refers to the strength of the cusped magnetic field within the vacuum chamber. More specifically, magnet strength is characterized by a current through coils 31 and 33 that is controlled to regulate magnetic strength. Magnetic strength impacts the flow of SiO from crucible 10 to crystal 27. That is, a high magnetic strength minimizes the flow of SiO from crucible 10 to crystal 27 by suppressing a buoyancy force within melt 25. As the magnetic field suppresses the buoyancy flow, it decreases the dissolution rate of the quartz crucible, thus lowering the interstitial oxygen incorporated into the crystal. However, if the magnetic field strength increases beyond a certain level, further retardation in the buoyancy flow may result in decreasing the evaporation rate at the melt free surface, thus raising the interstitial oxygen levels. Due to differences in the relative contribution of buoyancy flow to the oxygen content of the crystal at the late body formation stage relative to the intermediate body formation stage as described previously herein, an adjustment to the magnet strength at the late body formation stage enables appropriate modulation of buoyancy flow to reduce oxygen within the crystal formed at the late body formation stage.

In various embodiments, the method includes regulating the magnetic field strength in at least two stages including, but not limited to, the intermediate body growth stage and the late body growth stage. In one embodiment, the method includes regulating the magnetic field strength at the intermediate body growth stage such that the magnetic field strength is approximately 0.02 to 0.05 Tesla (T) at an edge of crystal 27 at the melt-solid interface and approximately 0.05 to 0.12 T at the wall of crucible 10. In another aspect, the method includes regulating the magnetic field strength at the late body growth stage such that the magnetic field strength is approximately 150% of the magnetic field strength used during the intermediate body growth stage, corresponding to approximately 0.03 to 0.075 T at an edge of crystal 27 at the melt-solid interface and approximately 0.075 to 0.18 T at the wall of crucible 10.

Figure 8C:
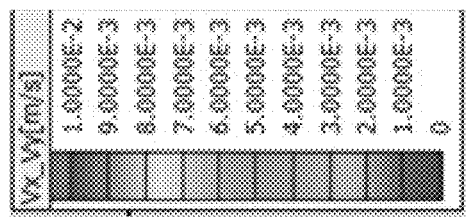
FIG. 8C is a cross-sectional view of an example crucible mapping flowlines and velocity magnitudes near a crucible wall at late body growth at a magnetic field strength corresponding to 150% balanced.
Figure 8C:
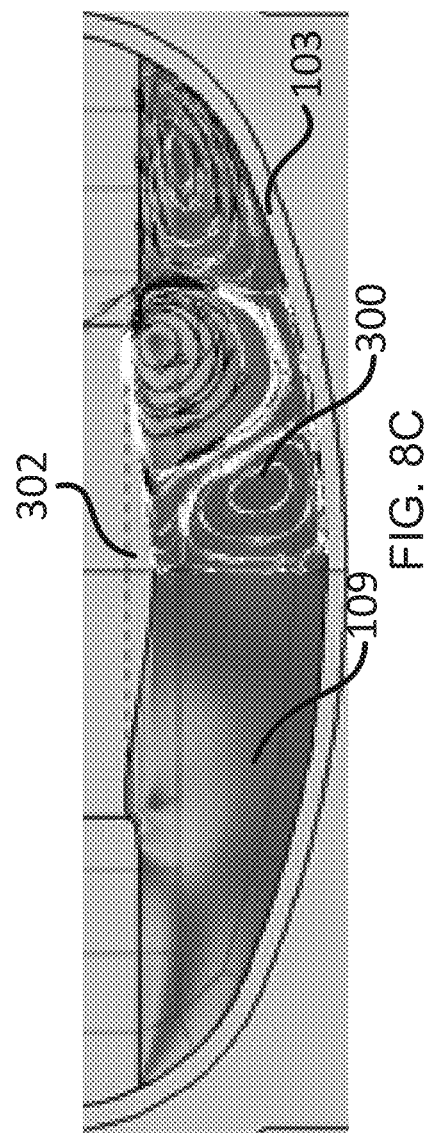

FIGS. 8A, 8B, and 8C are cross-sectional views of simulated flowlines and total speeds within melt 25 at a late body growth stage. FIG. 8A was simulated using magnetic field strengths corresponding to 50% of the magnetic field used at intermediate body growth stage (i.e., approximately 0.01 to 0.025 T at an edge of crystal 27 at the melt-solid interface and approximately 0.025 to 0.06 T at the wall of crucible 10). FIG. 8B was simulated using magnetic field strengths corresponding to 95% of the magnetic field used at intermediate body growth stage (i.e., approximately 0.019 to 0.0475 T at an edge of crystal 27 at the melt-solid interface and approximately 0.0475 to 0.114 T at the wall of crucible 10). FIG. 8C was simulated using magnetic field strengths corresponding to 150% of the magnetic field used at intermediate body growth stage (i.e., approximately 0.03 to 0.075 T at an edge of crystal 27 at the melt-solid interface and approximately 0.075 to 0.18 T at the wall of crucible 10). Comparing FIGS. 8A, 8B, and 8C, as the strength of the magnetic field increases, flow 300 from the bottom of crucible 10 to melt-crystal interface 302 transitions from relatively high convection to melt-crystal interface 302 at low magnetic field strength (FIG. 8A) to a relatively little convection at higher magnetic field strengths. This suppression of buoyancy flow within melt 25 by the increased magnetic field results in lower oxygen concentration in the resulting silicon ingot, as summarized in Table 1 below. At 150% magnetic field strength, the simulated oxygen concentration was within the desired range below 5% parts per million atoms (ppma).

TABLE 1

Effect of Magnetic Field Strength at Late Body Growth Stage on Oxygen Concentration in Silicon Ingots

| Magnetic Field Strength (% intermediate body growth stage field strength) | Simulated Oxygen Concentration (ppma) |
|---|---|
| 50% | 9.3 |
| 95% | 6.4 |
| 150% | 4.5 |

One or more additional process parameters may be regulated to facilitate producing silicon crystal ingots with a low oxygen concentration. However, the effects of these additional process parameters are not sensitive to the changes in the depth 200 of melt 25 within crucible 10 during growth of crystal 27. Consequently, the regulation of the additional process parameters described herein remains essentially the same between different stages of crystal growth, as described in additional detail below.

One additional process parameter that is controlled, at least in some embodiments, is wall temperature of crucible 10. The wall temperature of crucible 10 corresponds to a dissolution rate of crucible 10. Specifically, the higher the wall temperature of crucible 10, the faster that portions of crucible 10 will react with and dissolve into melt 25, generating SiO into the melt and potentially increasing an oxygen concentration of crystal 27 via the melt-crystal interface. Accordingly, reducing the wall temperature of crucible 10, as used herein, equates to reducing the dissolution rate of crucible 10. By reducing the wall temperature of crucible 10 (i.e., reducing the dissolution rate of crucible 10), the oxygen concentration of crystal 27 can be reduced. Wall temperature may be regulated by controlling one or more additional process parameters including, but not limited to heater power and melt to reflector gap.

Heater power is another process parameter that may be controlled in some embodiments to regulate the wall temperature of crucible 10. Heater power refers to the power of side and bottom heaters 105 and 106. Specifically, relative to typical heating configurations, by increasing a power of side heater 105 and reducing a power of bottom heater 106, a hot spot on the wall of crucible 10 is raised close to the melt line 36. As the wall temperature of crucible 10 at or below melt line 36 is lower, the amount of SiO generated by melt 25 reacting with crucible 10 is also lower. The heater power configuration also impacts melt flow by reducing the flow (i.e., transport) of SiO from crucible 10 to single crystal 27. In this embodiment, a power of bottom heater 106 is approximately 0 to 5 kilowatts, and more specifically approximately 0 kilowatts, and a power of side heater 105 is in a range from approximately 100 to 125 kilowatts. Variations in the power of side heater 105 may be due to, for example, variation in a hot zone age from puller to puller.

In some embodiments, melt to reflector gap is an additional process parameter that is controlled to regulate the wall temperature of crucible 10. Melt to reflector gap refers to a gap between melt line 36 and a heat reflector (not shown). Melt to reflector gap impacts the wall temperature of crucible 10. Specifically, a larger melt to reflector gap reduces the wall temperature of crucible 10. In this embodiment, the melt to reflector gap is between approximately 60 mm and 80 mm, and more specifically 70 mm.

Seed lift is an additional process parameter that is controlled to regulate the flow of SiO from crucible 10 to crystal 27. Seed lift refers to the rate at which pull shaft or cable 117 lifts seed crystal 115 out of melt 25. In one embodiment, seed crystal 115 is lifted at a rate in a range of approximately 0.42 to 0.55 millimeters per minute (mm/min), and more specifically 0.46 mm/min for 300 mm product. This pull rate is slower than pull rates typically used for smaller diameter (e.g., 200 mm) crystals. For example, the seed lift for 200 mm product may be in a range of approximately 0.55 to 0.85 mm/min, and more specifically 0.7 mm/min.

Pull speed is an additional process parameter that may be regulated to control the defect quality of the crystal. For example, using SP2 laser light scattering, the detected agglomerated point defects generated by the process described herein may be less than 400 counts for defects less than 60 nm, less than 100 counts for defects between 60 and 90 nm, and less than 100 counts for less defects between 90 and 120 nm.

In some embodiments, inert gas flow is an additional process parameter that is controlled to regulate the SiO evaporation from melt 25. Inert gas flow, as described herein, refers to the rate at which argon gas flows through vacuum chamber 101. Increasing the argon gas flow rate sweeps more SiO gas above melt line 36 away from crystal 27, minimizing a SiO gas partial pressure, and in turn increasing SiO evaporation. In this embodiment, the argon gas flow rate is in a range from approximately 100 slpm to 150 slpm.

Inert gas pressure is an additional process parameter also controlled to regulate the SiO evaporation from melt 27 in some embodiments. Inert gas pressure, as described herein, refers to the pressure of the argon gas flowing through vacuum chamber 101. Decreasing the argon gas pressure increases SiO evaporation and hence decreases SiO concentration in melt 25. In this embodiment, the argon gas pressure ranges from approximately 10 torr to 30 torr.

In suitable embodiments, cusp position is an additional process parameter that is controlled to regulate the wall temperature of crucible 10 and the flow of SiO from crucible 10 to crystal 27. Cusp position, as described herein, refers to the position of the cusp of the magnetic field generated by coils 31 and 33. Maintaining the cusp position below melt line 36 facilitates reducing the oxygen concentration. In this embodiment, the cusp position is set in a range from approximately 10 mm to 40 mm below melt line 36, more specifically, in a range of approximately 25 mm to 35 mm below melt line 36, and even more specifically, at approximately 30 mm.

By controlling process parameters (i.e., heater power, crucible rotation rate, magnet strength, seed lift, melt to reflector gap, inert gas flow, inert gas pressure, seed rotation rate, and cusp position) as described above, a plurality of process parameters (i.e., a wall temperature of a crucible, a flow of SiO from the crucible to a single crystal, and an evaporation of SiO from a melt) are regulated to produce silicon ingots having a low oxygen concentration. In one embodiment, the methods described herein facilitate producing a silicon ingot with an ingot diameter greater than approximately 150 millimeters (mm), a total ingot length of at least approximately 900 mm, and an oxygen concentration less than 5 ppma. In another embodiment, the methods described herein facilitate producing a silicon ingot with an ingot diameter ranging from approximately 150 mm to 460 mm, specifically approximately 300 mm, and an oxygen concentration less than 5 ppma. In another additional embodiment, the methods described herein facilitate producing a silicon ingot with a total ingot length ranging from approximately 900 mm to 1200 mm, and an oxygen concentration less than 5 ppma.

Wafers having low oxygen concentration using the systems and methods described herein may be advantageous in a variety of applications. For example, insulated-gate bipolar transistors (IGBTs), high quality radio-frequency (RF), high resistivity silicon on insulator (HR-SOI), and charge trap layer SOI (CTL-SOI) applications may benefit from the low oxygen concentration because they achieve high resistivity and do not have p-n junctions. Wafers produced for IGBT applications using the methods described herein may, for example, have 30 to 300 ohm-centimeter (ohm-cm) N-type resistivity or greater than 750 ohm-cm N/P-type resistivity. Further, wafers produced for RF, HR-SOI, and/or CTL-SOI applicants using the methods described herein may have, for example, greater than 750 ohm-cm P-type wafers. Wafers produced by the described systems and methods may also be used as handle wafers.

For P-type wafers produced using the methods described herein, boron, aluminum, germanium, and/or indium may be suitably used has a majority carrier, and red phosphorus, phosphorus, arsenic, and/or antimony may be used as a minority carrier. For N-type wafers produced using the methods described herein, red phosphorus, phosphorus, arsenic, and/or antimony may be used as the majority carrier, and boron, aluminum, germanium, and/or indium may be used as the minority carrier.

To improve mechanical strength and slip performance, wafers produced using the methods described herein may be co-doped (e.g., by doping the single crystal that forms the ingot) with nitrogen or carbon, due to the relatively low Oi of the wafers. For example, the nitrogen concentration may be varied between 0 to 8e15 atoms per cubic centimeter, and the carbon concentration may be varied between 0.0 to 2.0 ppma.

Example systems and methods of producing single crystal silicon ingots with relatively low oxygen concentration from a melt formed from polycrystalline silicon are described herein. These methods take advantage of changes in the structure of flow cells in the melt between a first and second stage of production of the ingot to produce relatively low oxygen silicon. During the first stage, the silicon ingot is relatively small and the depth of the melt is relatively deep. The second stage is characterized by a depleted melt depth within the crucible due to formation of the silicon ingot. In this second stage, a flow cell induced by rotation of the silicon ingot within the melt may contact the bottom of the crucible, causing unwanted inclusion of silicon oxide formed at the crucible bottom into the growing crystal ingot. The methods and systems described herein control production of the ingot to limit the including of the unwanted silicon oxide. Generally, at least one process parameter is changed during the second stage relative to its value during the first stage. Non-limiting examples of changes in process parameters from the first stage to the second stage include: reduced crystal rotation rate, reduced crucible rotation rate, increased magnetic field strength, and any combination thereof. For example, in some embodiments, the silicon ingot is rotated more slowly during the second stage to reduce contact of the rotation induced flow cell with the bottom of the crucible, and thereby reduce the amount oxygen included in the silicon ingot.

The systems and methods described herein enable the formation of single crystal silicon ingots with low oxygen concentration maintained over a longer ingot length than was achieved using previous methods. A detailed description of the effects of these changes in process parameters on the structure of flow cells within the crucible and the oxygen content of the silicon ingots formed using the method on various embodiments, are described in further detail herein.

Embodiments of the methods described herein achieve superior results compared to prior methods and systems. For example, the methods described herein facilitate producing silicon ingots with a lower oxygen concentration than at least some known methods. Further, unlike at least some known methods, the methods described herein may be used for the production of ingots having a diameter greater than 150 mm.

When introducing elements of the present invention or the embodiment(s) thereof, the articles "a", "an", "the" and "said" are intended to mean that there are one or more of the elements. The terms "comprising", "including" and "having" are intended to be inclusive and mean that there may be additional elements other than the listed elements.

Approximating language, as used herein throughout the specification and claims, may be applied to modify any quantitative representation that could permissibly vary without resulting in a change in the basic function to which it is related. Accordingly, a value modified by a term or terms, such as "about," "approximately," and "substantially," is not to be limited to the precise value specified. In at least some instances, the approximating language may correspond to the precision of an instrument for measuring the value. Here and throughout the specification and claims, range limitations may be combined and/or interchanged; such ranges are identified and include all the sub-ranges contained therein unless context or language indicates otherwise.

As various changes could be made in the above without departing from the scope of the invention, it is intended that all matter contained in the above description and shown in the accompanying drawings shall be interpreted as illustrative and not in a limiting sense.

What is claimed is:

1. A crystal growing system for producing a silicon ingot, the system comprising
   a vacuum chamber;
   a crucible disposed within the vacuum chamber, the crucible rotatable about an axis of symmetry, and configured to hold a melt including molten silicon;
   a pull shaft movable along the axis of symmetry and rotatable about the axis of symmetry, and configured to hold a seed crystal;
   at least one magnet to generate a controllable cusped magnetic field within the crucible;
   a control unit comprising a processor and a memory, the memory storing instruction that, when executed by the processor, cause the processor to:
      withdraw the seed crystal from a melt in the crucible to form the silicon ingot; and
      regulate at least one process parameter, wherein regulating the at least one process parameter comprises regulating a crystal rotation rate, wherein the at least one process parameter is regulated in at least two stages, the at least two stages comprising:
         a first stage corresponding to formation of the silicon ingot up to an intermediate ingot length; and
         a second stage corresponding to formation of the silicon ingot from the intermediate ingot length to the total ingot length; and
      wherein the instruction, when executed by the processor, cause the processor to regulate the crystal rotation rate by reducing a crystal rotation rate relative to the crystal rotation rate during the first stage.

2. The system of claim 1, wherein the memory stores instruction that, when executed by the processor, cause the processor to regulate the at least one process parameter by regulating the crystal rotation rate ranges between 8 rpm to 14 rpm during the first stage and regulating the crystal rotation rate ranges between 6 rpm to 8 rpm during the second stage.

3. The system of claim 1, wherein the memory stores instruction that, when executed by the processor, cause the processor to regulate the at least one process parameter by:
   regulating the crystal rotation rate to 12 rpm during the first stage; and
   decreasing the crystal rotation rate over time from 12 rpm at the end of the first stage to 8 rpm when the silicon ingot length reaches 950 mm; and
   maintaining the crystal rotation rate at 8 rpm during formation of the silicon ingot between the intermediate ingot length of 950 mm and the total ingot length.

4. The system of claim 1, wherein the memory stores instruction that, when executed by the processor, cause the processor to regulate the at least one process parameter by regulating a crucible rotation rate between 1.3 rpm and 2.2 rpm during the first stage, and between 0.5 rpm and 1.7 rpm during the second stage.

5. The system of claim 1, wherein the memory stores instruction that, when executed by the processor, cause the processor to regulate the at least one process parameter by regulating a crucible rotation rate to 1.7 rpm during the first stage, and between 0.5 rpm and 1.7 rpm during the second stage.

6. The system of claim 1, wherein the memory stores instruction that, when executed by the processor, cause the processor to regulate the at least one process parameter by regulating a magnetic field strength during the second stage to 150% of the magnetic field strength during the first stage.

7. The system of claim 1, wherein the memory stores instruction that, when executed by the processor, cause the processor to regulate the at least one process parameter by:
   regulating, during the first stage, a magnetic field strength to a strength between 0.02 and 0.05 Tesla at an edge of the silicon ingot at a melt-solid interface, and to a strength between 0.05 and 0.12 Tesla at a wall of the crucible; and
   regulating, during the second stage, the magnetic field strength to a strength between 0.03 and 0.075 Tesla at the edge of the silicon ingot at the melt-solid interface, and to a strength between 0.075 and 0.18 Tesla at the wall of the crucible.

8. The system of claim 1, further wherein the memory stores further instruction that, when executed by the processor, cause the processor to control a plurality of additional process parameters during the first and second stages.

9. The system of claim 8, wherein the plurality of additional process parameters comprise at least one of a heater power, a melt to reflector gap, a seed lift, a pull speed, an inert gas flow, an inert gas pressure, and a cusp position.

10. The system of claim 9, wherein the memory stores instruction that, when executed by the processor, cause the processor, for each parameter of the plurality of additional process parameters, to control the process parameter to be substantially the same during the first and second stages.

11. A crystal growing system for producing a silicon ingot, the system comprising
   a vacuum chamber;
   a crucible disposed within the vacuum chamber, the crucible rotatable about an axis of symmetry, and configured to hold a melt including molten silicon;

a pull shaft movable along the axis of symmetry and rotatable about the axis of symmetry, and configured to hold a seed crystal;

at least one magnet to generate a controllable cusped magnetic field within the crucible;

a control unit comprising a processor and a memory, the memory storing instruction that, when executed by the processor, cause the processor to:

withdraw the seed crystal from a melt in the crucible to form the silicon ingot; and regulate at least one process parameter, wherein regulating the at least one process parameter comprises regulating a crucible rotation rate, wherein the at least one process parameter is regulated in at least two stages, the at least two stages comprising:

a first stage corresponding to formation of the silicon ingot up to an intermediate ingot length; and a second stage corresponding to formation of the silicon ingot from the intermediate ingot length to the total ingot length; and wherein the instruction, when executed by the processor, cause the processor to regulate the crucible rotation rate by reducing a crucible rotation rate relative to the crucible rotation rate during the first stage.

12. The system of claim 11, wherein the memory stores instruction that, when executed by the processor, cause the processor to regulate the at least one process parameter by regulating the crucible rotation rate to 1.7 rpm during the first stage, and between 0.5 rpm and 1.7 rpm during the second stage.

13. The system of claim 11, wherein the memory stores instruction that, when executed by the processor, cause the processor to regulate the at least one process parameter by:

regulating the crucible rotation rate to 1.7 rpm during the first stage; and decreasing the crucible rotation rate over time from 1.7 rpm at the end of the first stage to 0.5 rpm when the silicon ingot length reaches 950 mm; and maintaining the crucible rotation rate at 0.5 rpm during formation of the silicon ingot between the intermediate ingot length of 950 mm and the total ingot length.

14. The system of claim 11, wherein the memory stores instruction that, when executed by the processor, cause the processor to regulate the at least one process parameter by regulating a magnetic field strength during the second stage to 150% of the magnetic field strength during the first stage.

15. The system of claim 11, wherein the memory stores instruction that, when executed by the processor, cause the processor to regulate the at least one process parameter by:

regulating, during the first stage, a magnetic field strength to a strength between 0.02 and 0.05 Tesla at an edge of the silicon ingot at a melt-solid interface, and to a strength between 0.05 and 0.12 Tesla at a wall of the crucible; and regulating, during the second stage, the magnetic field strength to a strength between 0.03 and 0.075 Tesla at the edge of the silicon ingot at the melt-solid interface, and to a strength between 0.075 and 0.18 Tesla at the wall of the crucible.

16. The system of claim 11, further wherein the memory stores further instruction that, when executed by the processor, cause the processor to control a plurality of additional process parameters during the first and second stages, the plurality of additional process parameters comprising at least one of a heater power, a melt to reflector gap, a seed lift, a pull speed, an inert gas flow, an inert gas pressure, and a cusp position.

17. The system of claim 16, wherein the memory stores instruction that, when executed by the processor, cause the processor, for each parameter of the plurality of additional process parameters, to control the process parameter to be substantially the same during the first and second stages.

* * * * *